United States Patent
Skertic et al.

(10) Patent No.: US 12,520,417 B2
(45) Date of Patent: Jan. 6, 2026

(54) CIRCUIT BOARD ASSEMBLY HAVING A SECURITY SHIELD AND METHOD OF THE SAME

(71) Applicants: Rolls-Royce North American Technologies Inc., Indianapolis, IN (US); Rolls-Royce Corporation, Indianapolis, IN (US)

(72) Inventors: Richard Joseph Skertic, Indianapolis, IN (US); John Joseph Costello, Indianapolis, IN (US)

(73) Assignees: Rolls-Royce North American Technologies Inc., Indianapolis, IN (US); Rolls-Royce Corporation, Indianapolis, IN (US)

( * ) Notice: Subject to any disclaimer, the term of this patent is extended or adjusted under 35 U.S.C. 154(b) by 178 days.

(21) Appl. No.: 18/064,435

(22) Filed: Dec. 12, 2022

(65) Prior Publication Data
US 2024/0196525 A1   Jun. 13, 2024

(51) Int. Cl.
*H05K 1/02* (2006.01)
*H05K 1/14* (2006.01)

(52) U.S. Cl.
CPC ............. *H05K 1/0275* (2013.01); *H05K 1/14* (2013.01); *H05K 2201/09227* (2013.01); *H05K 2201/093* (2013.01)

(58) Field of Classification Search
CPC ......... H05K 1/02; H05K 1/0215–0224; H05K 1/0236; H01L 23/498; H01L 23/552
USPC .......... 361/790–795, 816, 818; 257/659–662
See application file for complete search history.

(56) References Cited

U.S. PATENT DOCUMENTS

| | | | | |
|---|---|---|---|---|
| 6,194,655 B1* | 2/2001 | Lange, Sr. | ........... | H05K 9/0032 361/752 |
| 6,734,541 B2* | 5/2004 | Shimoe | ............... | H01L 25/0657 257/723 |
| 7,480,153 B2* | 1/2009 | Kong | .................... | H05K 9/0026 361/818 |
| 7,557,445 B2* | 7/2009 | Choi | ................. | H01L 23/49811 439/74 |
| 7,687,899 B1* | 3/2010 | Berry | .................. | H01L 23/5385 257/E23.003 |
| 8,008,753 B1* | 8/2011 | Bolognia | ............ | H01L 25/0655 257/659 |
| 8,102,032 B1* | 1/2012 | Bolognia | ............ | H01L 23/3128 257/659 |
| 8,227,903 B2* | 7/2012 | Lee | .................... | H01L 23/49838 257/730 |
| 9,385,077 B2* | 7/2016 | Kim | ........................ | H05K 3/284 |
| 10,165,405 B2 | 12/2018 | Ho | | |

(Continued)

FOREIGN PATENT DOCUMENTS

CN     200480026372.6     10/2006

*Primary Examiner* — Tuan T Dinh
(74) *Attorney, Agent, or Firm* — Barnes & Thornburg

(57) ABSTRACT

A circuit board assembly includes a first printed circuit board having at least one trace plane. The trace plane has a plurality of traces secured to a core material of the first printed circuit board. A security layer is included, where the security layer at least partially covers the at least one trace plane such that the security layer forms at least one of a ground shield and an electromagnetic shield over the at least one trace plane. In some implementations, the security layer is integral with a core material of the circuit board.

18 Claims, 3 Drawing Sheets

FIG. 8

(56) References Cited

U.S. PATENT DOCUMENTS

| | | |
|---|---|---|
| 10,784,210 B2 * | 9/2020 | Kim .................... H01L 24/94 |
| 2009/0073671 A1 | 3/2009 | Lin |
| 2009/0135576 A1 | 5/2009 | Chao |
| 2010/0110656 A1 * | 5/2010 | Ko ..................... H01L 23/3121 |
| | | 361/818 |
| 2010/0149780 A1 | 6/2010 | Ren et al. |
| 2010/0250497 A1 | 9/2010 | Redlich et al. |
| 2011/0299264 A1 * | 12/2011 | Kim .................... H05K 1/0236 |
| | | 361/818 |
| 2012/0195017 A1 * | 8/2012 | Lee .................... H05K 3/4697 |
| | | 361/791 |
| 2013/0114235 A1 * | 5/2013 | Leal ................... H01L 23/552 |
| | | 361/818 |
| 2014/0048326 A1 * | 2/2014 | Lin .................... H05K 9/00 |
| | | 174/377 |
| 2017/0290155 A1 * | 10/2017 | Elsherbini ............ H05K 1/0218 |
| 2021/0160999 A1 * | 5/2021 | Dogiamis ............ H05K 9/0037 |

* cited by examiner

CIRCUIT BOARD ASSEMBLY HAVING A SECURITY SHIELD AND METHOD OF THE SAME

TECHNICAL FIELD

The present embodiments relate to the cyber-hardening of circuit boards and circuit board assemblies to prevent cyber snooping, tampering, and hacking.

BACKGROUND

Electronic circuit board assemblies used in aerospace and other industrial applications are typically manufactured with one to four coplanar layers of interconnecting traces. These assemblies may also have integrated test nodes that are accessible on an outer surface via electrical connection, and which are used to assess the circuit operation for pass-off tests, maintenance inspections, and other functions. As a result, these circuit board assemblies have numerous physical access points that can be easily monitored directly or indirectly with an oscilloscope. In some circumstances, bad actors may be able to use this information in a lab environment, perhaps with sophisticated hacking tools, to find out how the circuit operates and identify cybersecurity weaknesses in the system. Other types of power and signal traces, e.g. on the surface of the circuit board, may also be accessible via a scope probe or electromagnetic probe that samples radiated emissions corresponding to circuit board operation.

In view of this background, the present disclosure provides improved devices for improved cybersecurity relative to the current state of the art.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

FIG. 6 is an illustration showing a cross-section view about section 6-6 depicted in FIG. 3.

DETAILED DESCRIPTION

As discussed in the background above, externally-accessible access points are vulnerable to hackers and other bad actors investigating a circuit board assembly. To address this issue, the embodiments described herein include cyber hardening features for circuit board assemblies. By way of an introductory example, a circuit board assembly may include a circuit board that is at least partially covered by a security layer, where the security layer provides at least one of a ground shield and an electromagnetic shield.

Figure 1:
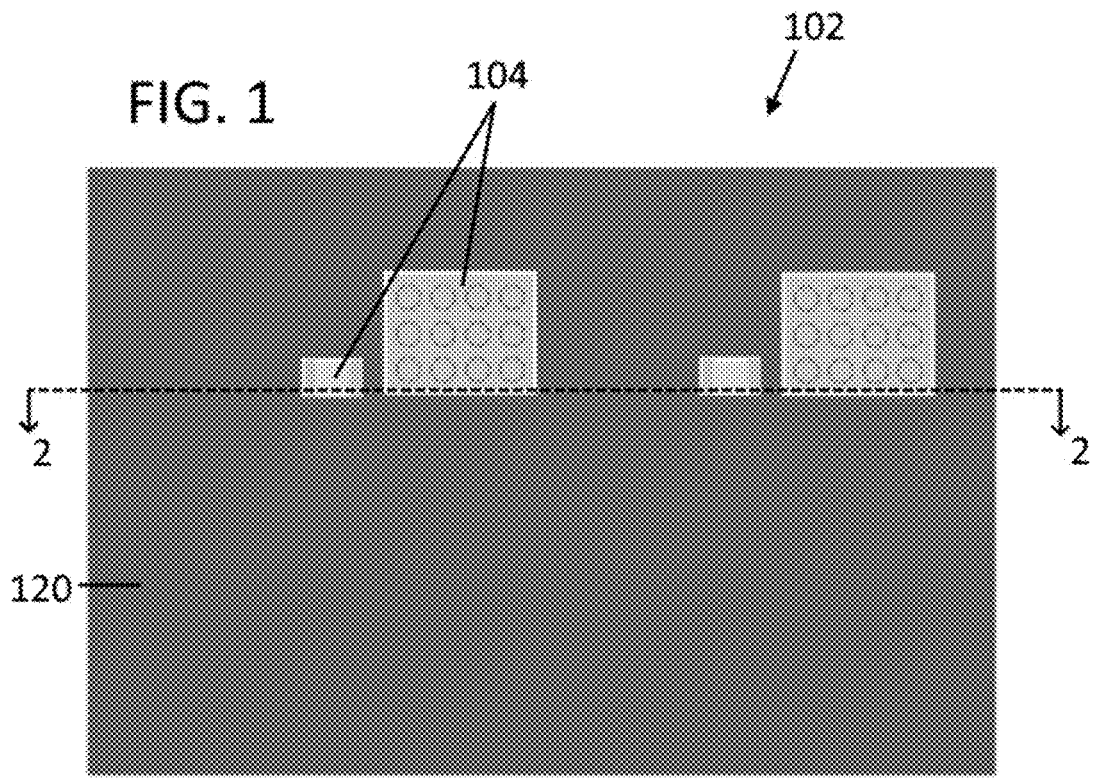
FIG. 1 is an illustration showing a top view of a circuit board assembly in accordance with certain aspects of the present disclosure.
Figure 2:
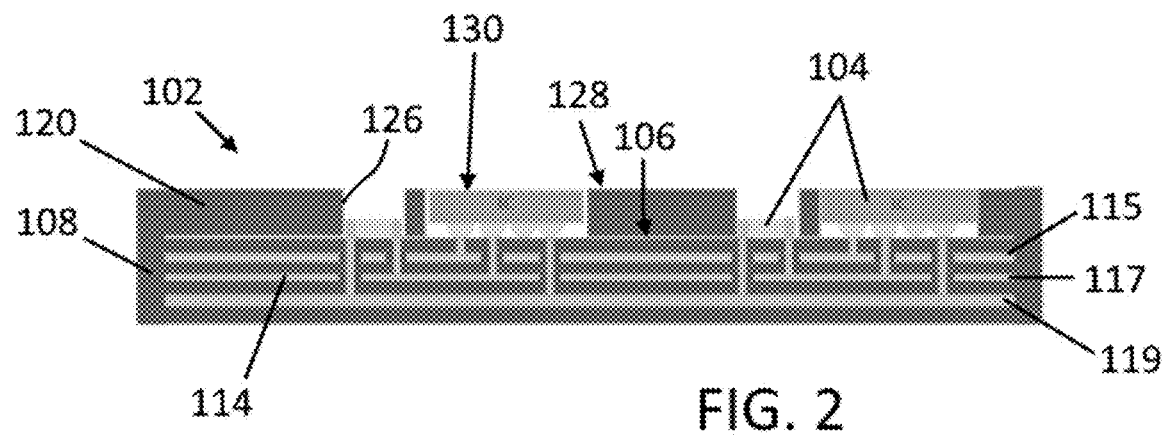
FIG. 2 is an illustration showing a cross-section view about section 2-2 depicted in FIG. 1.
Figure 5:
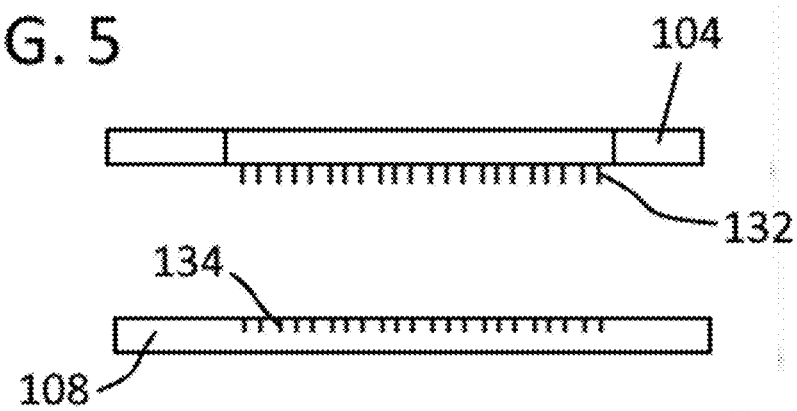
FIG. 5 is an illustration showing a cross-section view about section 5-5 depicted in FIG. 4.

FIGS. 1-2 depict an example of a circuit board assembly 102 that is cyber hardened. The circuit board assembly 102 generally includes a circuit board 108 that is electrically connected to one or more electronic components 104, where each electronic component may be any suitable semiconductor device or other electronic component (e.g., a packaged integrated circuit). The electronic components 104 may be secured to a top surface 106 of the circuit board 108 to form an electrical connection with certain traces 114 of the circuit board 108 (perhaps in a ball grid array format, as discussed in more detail below).

The circuit board 108 may be a multi-layered printed circuit board such that it has multiple planes, each plane including a conductive layer having traces 114. Hereafter, a "trace plane" is defined as a plane within a circuit board that includes a planar layout of conductive traces for transferring electrical signals through the device. In the depicted example, three trace planes are included: first trace plane 115 (which may be a power plane), a second trace plane 117 (which may be a signal plane), and a third trace plane 119 (which may be a ground plane). The traces 114 within the trace planes may be formed of a copper or another suitable conductive material, and the traces 114 may be generally surrounded by a non-conductive (e.g., insulating) and/or dielectric material, hereafter referred to as the "core material." Without limitation, the core material may include a glass fibre reinforced epoxy resin, which those skilled in the art may recognize as "FR4." More or fewer trace planes may be included depending on the complexity and other design parameters of the circuit board.

The circuit board assembly 102 may also include a security layer 120, which may be discrete or otherwise distinguishable from the trace planes discussed above. In FIGS. 1-2, the security layer 120 is located on top of the upper-most trace layer 115 of the circuit board 108 (recognizing that "top" and "upper" are not limiting and are used only for simplicity with reference to the point-of-views of the figures). In particular, the security layer 120 may be generally planer (although other shapes and configurations are alternatively contemplated) and may be generally parallel to the trace layers of the circuit board 108. In certain exemplary embodiments, at least the traces 114 of the circuit board 108 may be substantially covered by the security layer 120 from a top perspective such that the traces 114 are not accessible visually, with a contact probe, or otherwise. The security layer 120 may additionally or alternatively provide other types of protection, such as insulation from extreme temperatures, protections from liquids or gasses, or the like.

The security layer 120 may be formed with any suitable material. In certain embodiments, the security layer 120 may be formed with a material that is common with adjacent materials in the circuit board 108, such as the non-conductive material that generally surrounds the traces 114. For example, the security layer 120 may be formed of the glass fibre reinforced epoxy resin ("FR4"). Advantageously, by using a common material, the security layer 120 may have common thermal expansion characteristics with the underlying trace layers, thereby ensuring a sound physical structure. However, other materials may additionally or alternatively be used for the security layer.

The security layer 120 may be coupled to the remainder of the circuit board 108 with any suitable device or method. For example, particularly when the security layer 120 is formed during board manufacturing, the security layer 120 may be laminated adjacent to the top-most trace layer with high heat and pressure during PCB manufacturing, thereby causing the security layer 120 to have a material that is integral and uniform relative to the core material of the circuit board. Alternatively, the security layer 120 may be secured to the top trace layer with an adhesive, a mechanical fastener such as a screw or clamp, or the like. In certain exemplary embodiments, the security layer 120 is attached to the remainder of the circuit board 108 in such a way that removal of the security layer 120 necessarily damages the underlying trace layer(s), thereby interfering with tempering attempts.

In addition to being a physical barrier, the security layer 120 may also provide an electrical shield over the trace layers. For example, the security layer 120 may generally act as a ground shield (or a separate ground shield may be included), which may prevent external interference of signals traveling through the circuit board as well as external detection of such signals.

Additionally or alternatively, the security layer 120 may include an electromagnetic shield to reduce or block electromagnetic radiation from escaping the device (thereby blocking evaluation of such electromagnetic radiation by a bad actor). To form an electromagnet shield, the security layer 120 may generally include a sheet metal, metal screen, metal foam, or the like. Notably, the electromagnetic shield material may be integral with the material forming the ground shield, and in some cases, these two shields may not be physically distinguishable. By contrast, the security layer 120 may itself be a multi-layer device having different layers for different functions, such as a first layer that generally provides the ground shield and a second layer that generally provides the electromagnetic shield. When the security layer 120 includes multiple layers, more than two layers are contemplated, including but not limited to a heat-deflecting or heat-insulating layer, a cushioning layer for high-impact applications, or the like.

The security layer 120 may have any suitable thickness, which is defined herein as a cross-sectional dimension that is perpendicular to the planar direction defined by the trace layers. If multiple layers, the thickness of each layer 120 may be selected for its function, as appropriate. In certain implementations and as shown in FIG. 2, the thickness of the security layer 120 may be substantially larger than a thickness of at least one of the trace layers, for example at least 50% larger, at least 100% larger, at least 200% larger, etc. In certain exemplary embodiments, the thickness of the security layer is be at least the height of the tallest component that it is cyber-hardening and is preferably "slightly" taller (e.g. 0.1 inches higher) than this to allow other layers (e.g., boards) to be flat/level and co-planar when other components are secured within an adjacent layer. While any suitable thickness dimension is contemplated, the advantages discussed herein are particularly apparent when the thickness of the security layer 120 is from about 0.1 inches to about 0.4 inches, which provides adequate security without overly increasing the size, weight, or cooling properties of the device.

In some embodiments, the security layer 120 may substantially cover the electronic components 104 (meaning the electronic components 104 are beneath the shielding discussed above). In contrast, the security layer 120 depicted in FIGS. 1-2 includes a plurality of openings 126 that align with the electronic components 104 such that, when assembled, the electronic components 104 are visible and/or otherwise accessible from a top perspective (FIG. 1) of the circuit board. As shown in FIG. 2, the thickness of the security layer 120 may be selected such that the top surface 128 of the security layer 120 is generally flush with a top surface 130 of the largest/tallest electronic component 104, which may be advantageous for providing a generally-uniform packaged without substantial snare points.

Notably, only one security layer 120 is included in FIGS. 1-2 on the top side of the device. In other embodiments, additional security layers may be included, each security layer having certain aspects and advantages discussed above. For example, a security layer may be located on the bottom side of the circuit board, on the sides of the circuit board, etc. In some embodiments, a security layer may not necessarily be uniform but may have a different structure over different areas of the circuit board (e.g., where different shielding types are needed in different areas). The security layer may also provide visual camouflage over certain features, particularly test nodes and the like, to prevent obvious identification by snoopers.

Figure 3:
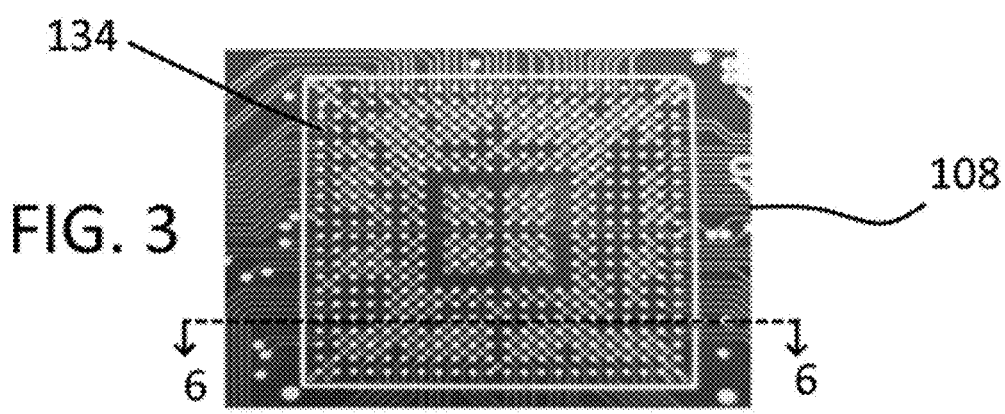
FIG. 3 is an illustration showing a top view of a portion of a circuit board having openings of the ball grid array for receiving the interconnection pins depicted in FIG. 4 in accordance with certain aspects of the present disclosure.
Figure 4:
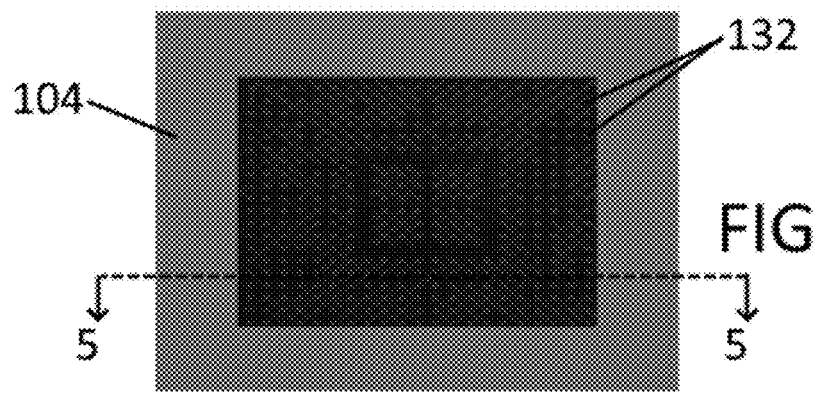
FIG. 4 is an illustration showing an electronic component having interconnection pins for receipt within the openings depicted in FIG. 3 in accordance with certain aspects of the present disclosure.

To provide anti-tampering at locations adjacent to the electronic components 104, at least one of the electronic components 104 (and perhaps all of them) may include only ball grid array ("BGA") surface mounts. When such an interface is used, the circuit board assembly may have zero points of physical access from an external perspective. Referring to FIGS. 3-6, a ball grid array may include a surface-mount system that has a plurality of interconnection pins 132 (or other protrusions, such as balls) that extend vertically from the electronic component 104, where the interconnection pins 132 are received by a set of corresponding openings 134 or other contact points on the circuit board 108 (which is depicted in FIG. 3 without a security layer). An advantage of ball grid array devices in the context of the present embodiments is that the interconnection pins 132 extend vertically below the electronic component 104 such that they are not accessible such that, when the electronic component 104 is installed on the circuit board 108, the interconnection pins 132 are completely covered by the electronic component 104 from a top perspective. In other words, the interconnection pins 132 cannot be accessed on the sides of the electronic component 104, and attempting to access the interconnection pins 132 when the electronic component is installed and operational would require penetrating the circuit board 108 (likely damaging the device and therefore interrupting the tampering effort). In addition, each (or at least a portion) of the interconnection pins 132 of the ball grid array may be soldered in place, meaning that attempts at removing the electronic component would damage the underlying connectors of the circuit board.

The openings 134 of the security layer 120 may be substantially flush with, and optionally in contact with, the sides of the electronic component 104 to further inhibit attempts at tampering. Optionally, the security layer 120 may be compliant, meaning it may contact/adapt to the outer surfaces of the electronic components to provide flush contact and prevent entry by snoopers.

Figure 7:
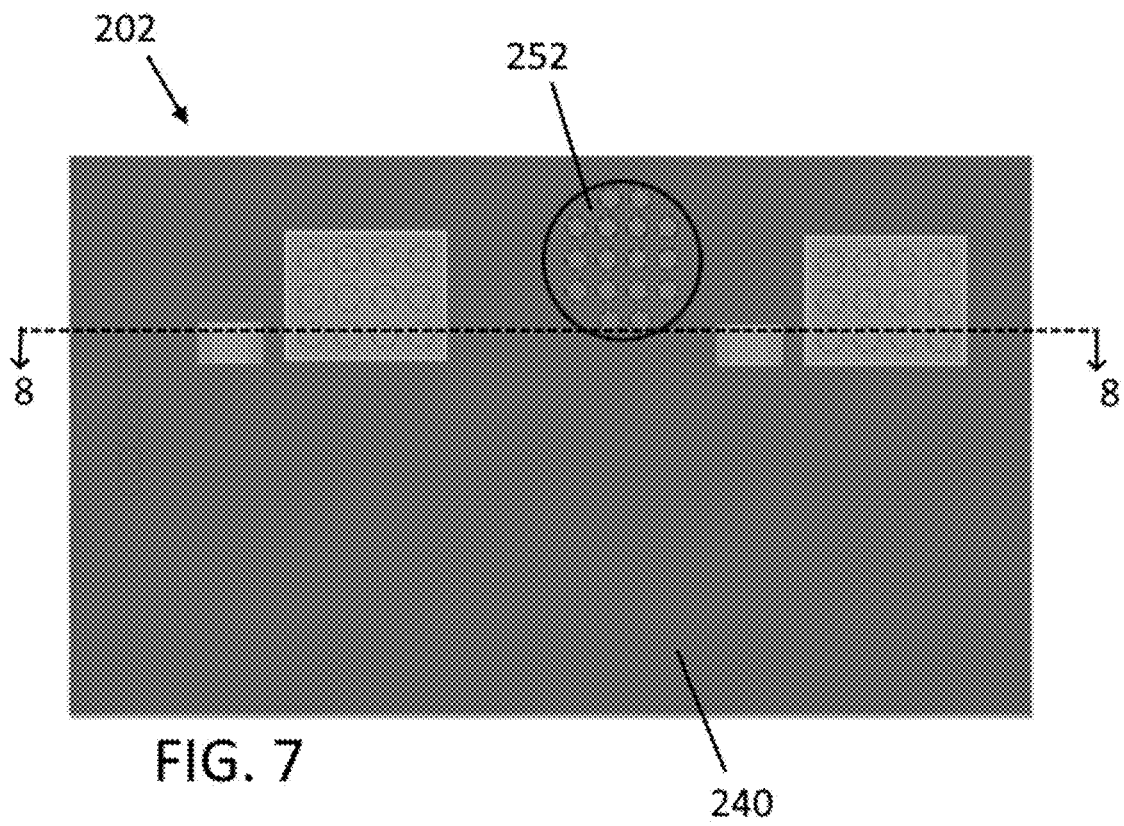
FIG. 7 is an illustration showing a top view of a circuit board assembly having multiple circuit boards and an external connection in accordance with certain aspects of the present disclosure.
Figure 8:
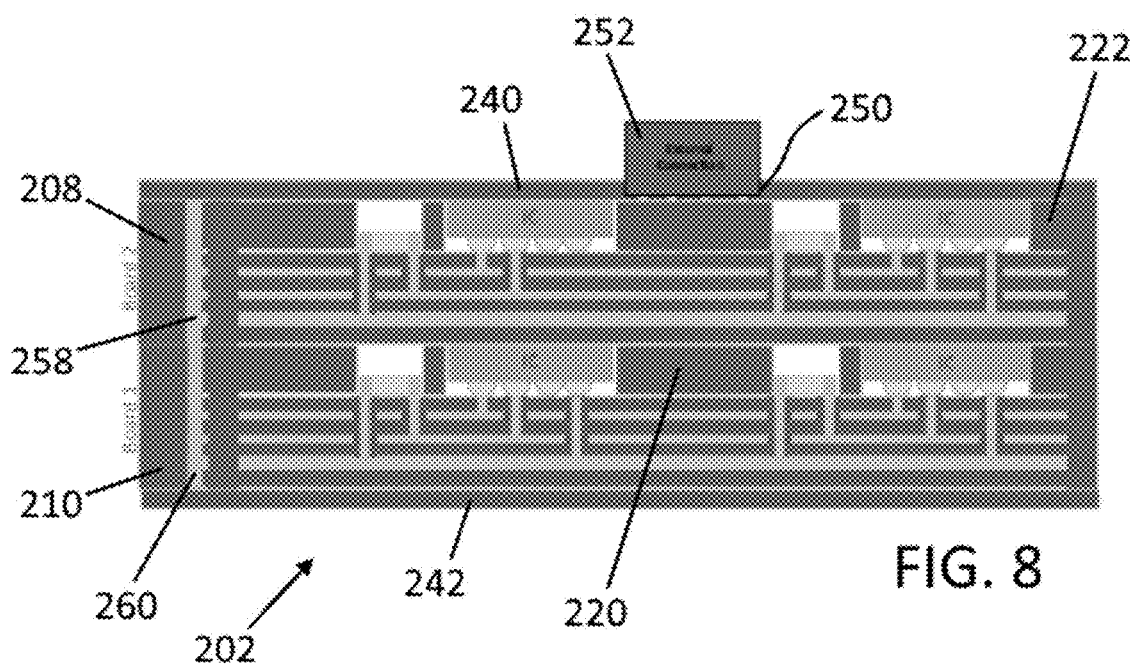
FIG. 8 is an illustration showing a cross-section view about section 8-8 depicted in FIG. 7.

FIGS. 7-8 shows an embodiment of a circuit board assembly 202 having multiple circuit boards. As shown, a first circuit board 208 and the second circuit board 210 may be similar to the circuit board 108 discussed above with reference to FIGS. 1-2. If formed as an integral body (which is optional), the first circuit board 208 and the second circuit board 210) may be distinguished via their respective connections to different inter-board busses 258, 260, which are separated from one-another via the core material. While the first circuit board 208 and the second circuit board 210 are depicted as being identical in FIGS. 7-8, it will be recognized that the circuit boards may differ in various aspects, as they may be included for different system functions.

Each of the first circuit board 208 and the second circuit board 210 include a respective security layer. That is, the first circuit board 208 includes a first security layer 220 and the second circuit board 210 includes a second security layer 222. Advantageously, this embodiment ensures that a security layer will shield each circuit board even where a tampering attempt successfully separates the boards from each other. In other embodiments that are not depicted, the assembly may lack a security layer at a middle location between the first circuit board 208 and the second circuit board 210, particularly where the first and second boards are formed as a unitary body.

In addition to (or as an alternative to) the security layers 220, 222, the circuit board assembly 202 may include one or more tamper covers 240, 242 that form an exterior surface of the circuit board assembly 202. For example, a top tamper cover 240 and a bottom tamper cover 242 may generally cover the top and bottom of the interior components (e.g., the circuit boards, security layers, electronic components, and the like). The tamper covers 240, 242 are optional, and they may be generally placed over the above-described security layer 220 upon manufacturing and/or assembly of the circuit board assembly 202. While not shown, side tamper covers may also be included. In some embodiments, the tamper covers may simply be an extension of the security layers as discussed above, and/or they may have any of the protection and shielding aspects discussed with reference to the security layers as described herein.

The tamper covers 240, 242 may include one or more interface openings 250 capable of receiving an external connection 252, which is shown in FIGS. 7-8. In all other locations, the tamper covers may be generally uniform and non-porous such that it substantially covers the remainder of the device.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the in the broadest sense, superseding any other implied definitions hereinbefore or hereinafter unless expressly asserted herein to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

While various embodiments have been described, it will be apparent to those of ordinary skill in the art that many more embodiments and implementations are possible. Accordingly, the embodiments described herein are examples, not the only possible embodiments and implementations.

The subject-matter of the disclosure may also relate, among others, to the following aspects:

In aspect 1, a circuit board assembly may include one or more of the following features: a first printed circuit board having at least one trace plane, the trace plane including a plurality of traces secured to a core material of the first printed circuit board; and a security layer, where the security layer at least partially covers the at least one trace plane such that the security layer forms at least one of a ground shield and an electromagnetic shield over the at least one trace plane.

In aspect 2, the circuit board assembly of aspect 1 may also include at least one electronic component that is secured to the first circuit board, where an electrical connection between the first circuit board and the at least one electronic component consists of a ball grid array.

In aspect 3, the circuit board assembly of aspect 2 may have the ball grid array with a set of vertical pins extending from the electronic component and a set of corresponding openings on the first circuit board.

In aspect 4, the circuit board assembly of one of aspects 2-3 may have the security layer including an opening, and where the electronic component is positioned within the opening of the security layer such that a surface of the electronic component is exposed outside of the security layer.

In aspect 5, the circuit board assembly of aspect 4 may further include a tamper cover, where the tamper cover substantially covers the security layer and the electronic component from an external perspective.

In aspect 6, the circuit board assembly of any of aspects 1-5 may have the security layer including the core material.

In aspect 7, the circuit board assembly of aspect 6 may be implemented such that the core material of the security layer is integral with the core material of the first circuit board.

In aspect 8, the circuit board assembly of any of aspects 1-7 may further include a second circuit board that is coupled to the first circuit board, where the security layer is included between the first circuit board and the second circuit board.

In aspect 9, the circuit board assembly of aspect 8 may further include a second security layer, where the second circuit board is located between the security layer and the second security layer.

In aspect 10, the circuit board assembly of any of aspects 8-9 may be implemented such that the first circuit board includes a first inter-board bus, where the second circuit board includes a second inter-board bus, and where the first inter-board bus is separated from the second inter-board bus via the core material.

In aspect 11, a circuit board assembly may include one or more of the following features: a first printed circuit board having at least one trace plane, the trace plane including a plurality of traces secured to a core material of the first printed circuit board; and a security layer, where the security layer at least partially covers the at least one trace plane, and where the security layer includes the core material such that the security layer is integral with the core material of the first circuit board.

In aspect 12, the circuit board assembly of aspect 11 may be implemented such that a thickness of the security layer is about 0.1 inches to about 0.4 inches.

In aspect 13, the circuit board assembly of any of aspects 11-12 may further include at least one electronic component that is secured to the first circuit board, where an electrical connection between the first circuit board and the at least one electronic component consists of a ball grid array.

In aspect 14, the circuit board assembly of aspect 13 may be implemented such that the ball grid array includes a set of vertical pins extending from the electronic component and a set of corresponding openings on the first circuit board.

In aspect 15, the circuit board assembly of aspect 13 may be implemented such that the security layer includes an opening, and where the electronic component is positioned within the opening of the security layer such that a surface of the electronic component is exposed outside of the security layer.

In aspect 16, the circuit board assembly of aspect 15 may further include a tamper cover, where the tamper cover substantially covers the security layer and the electronic component from an external perspective.

In aspect 17, the circuit board assembly of any of aspects 11-16 may further include a second circuit board that is coupled to the first circuit board, where the security layer is included between the first circuit board and the second circuit board.

In aspect 18, the circuit board assembly of aspect 17 may further include a second security layer, where the second circuit board is located between the security layer and the second security layer.

In aspect 19, a method may include one or more of the following steps: assembling a circuit board assembly, the circuit board assembly including: a first printed circuit board having at least one trace plane, the trace plane including a plurality of traces secured to a core material of the first printed circuit board; a security layer, where the security layer at least partially covers the at least one trace plane such that the security layer forms at least one of a ground shield and an electromagnetic shield over the at least one trace plane.

In aspect 20, the method of aspect 19 may further include connecting at least one electronic component to the first circuit board, where an electrical connection between the first circuit board and the at least one electronic component consists of a ball grid array.

The invention claimed is:
1. A circuit board assembly, comprising:
   a first printed circuit board having an upper exterior surface, a lower exterior surface opposite the upper exterior surface, a plurality of side surfaces extending between the upper exterior surface and the lower exterior surface, and at least one trace plane disposed between the upper exterior surface and the lower exterior surface and within the plurality of side surfaces, the trace plane including a plurality of traces secured to a core material of the first printed circuit board;
   a first security layer having an opening, wherein the first security layer at least partially covers the upper exterior surface of the first printed circuit board and the at least one trace plane such that the first security layer forms at least one of a ground shield and an electromagnetic shield over the at least one trace plane;
   at least one electronic component secured to the first circuit board and positioned within the opening of the first security layer; and
   a second circuit board that is coupled to the first security layer such that the first security layer is included between the first printed circuit board and the second circuit board, the first security layer disposed between a lower exterior surface of the second circuit board and the upper exterior surface of the first circuit board, the lower exterior surface of the second circuit board forming a continuous, unbroken layer coving a bottom of a respective at least one trace plane of the second circuit board,
   wherein the core material of the first printed circuit board, the first security layer, and the at least one electronic component cooperate to fully enclose the plurality of traces of the circuit board assembly such that the plurality of traces are blocked from external physical access, the core material of the first printed circuit board forming a continuous, unbroken layer coving a lower surface of the bottom-most trace of the plurality of traces.

2. The circuit board assembly of claim 1, wherein an electrical connection between the first circuit board and the at least one electronic component consists of a ball grid array.

3. The circuit board assembly of claim 1, further comprising a tamper cover, wherein the tamper cover substantially covers the first security layer and the electronic component from an external perspective.

4. The circuit board assembly of claim 1, wherein the first security layer includes the core material and the core material of the first security layer is integral with the core material of the first circuit board.

5. The circuit board assembly of claim 1, further comprising a second security layer at least partially covering an upper exterior surface of the second circuit board, wherein the second circuit board is located between the first security layer and the second security layer.

6. The circuit board assembly of claim 1, wherein the first circuit board includes a first inter-board bus, wherein the second circuit board includes a second inter-board bus, and wherein the first inter-board bus is separated from the second inter-board bus via the core material.

7. The circuit board assembly of claim 2, wherein the ball grid array includes a set of vertical pins extending from the electronic component and a set of corresponding openings on the first circuit board.

8. The circuit board assembly of claim 4, wherein the core material comprises a resin.

9. The circuit board assembly of claim 5, further comprising an upper tamper cover and a lower tamper cover, wherein the upper tamper cover substantially covers the second security layer and an electronic component secured to the second circuit board from an external perspective, and wherein the lower tamper cover covers the lower exterior surface of the first circuit board.

10. The circuit board assembly of claim 8, wherein the core material of the first security layer and the core material of the first circuit board comprise a glass fiber reinforced epoxy resin.

11. A circuit board assembly, comprising:
   a first printed circuit board having an upper exterior surface, a lower exterior surface opposite the upper exterior surface, a plurality of side surfaces extending between the upper exterior surface and the lower exterior surface, and at least one trace plane disposed between the upper exterior surface and the lower exterior surface and within the plurality of side surfaces, the trace plane including a plurality of traces secured to a core material of the first printed circuit board;
   a first security layer having an opening, wherein the first security layer at least partially covers the upper exterior surface of the first printed circuit board and the at least one trace plane;
   a second circuit board that is coupled to the first security layer such that the first security layer is included between the first circuit board and the second circuit board, the first security layer disposed between a lower exterior surface of the second circuit board and the upper exterior surface of the first circuit board, the lower exterior surface of the second circuit board forming a continuous, unbroken layer coving a bottom of a respective at least one trace plane of the second circuit board; and at least one electronic component secured to the first circuit board and positioned withing the opening of the first security layer, wherein the first security layer includes the core material such that the first security layer is integral with the core material of the first circuit board and the core material of the first printed circuit board, the first security layer, and the at least one electronic component cooperate to fully enclose the plurality of traces of the circuit board assembly such that the plurality of traces are blocked from external physical access, the core material of the first printed circuit board forming a continuous, unbroken layer covering a lower surface of the bottom-most trace of the plurality of traces.

12. The circuit board assembly of claim 11, wherein a thickness of the first security layer is about 0.1 inches to about 0.4 inches.

13. The circuit board assembly of claim 11, wherein an electrical connection between the first circuit board and the at least one electronic component consists of a ball grid array.

14. The circuit board assembly of claim 11, further comprising a second security layer at least partially covering an upper exterior surface of the second circuit board, wherein the second circuit board is located between the first security layer and the second security layer.

15. The circuit board assembly of claim 11, wherein the core material of the first security layer and the core material of the first circuit board comprise a glass fiber reinforced epoxy resin.

16. The circuit board assembly of claim 13, wherein the ball grid array includes a set of vertical pins extending from the electronic component and a set of corresponding openings on the first circuit board.

17. A method of assembling a circuit board assembly, comprising:

assembling the circuit board assembly, the circuit board assembly comprising:

a first printed circuit board having an upper exterior surface, a lower exterior surface opposite the upper exterior surface, a plurality of side surfaces extending between the upper exterior surface and the lower exterior surface, and at least one trace plane disposed between the upper exterior surface and the lower exterior surface and within the plurality of side surfaces, the trace plane including a plurality of traces secured to a core material of the first printed circuit board;

a first security layer having an opening, wherein the first security layer at least partially covers the upper exterior surface of the first printed circuit board and the at least one trace plane such that the first security layer forms at least one of a ground shield and an electromagnetic shield over the at least one trace plane;

a second circuit board that is coupled to the first security layer such that the first security layer is included between the first printed circuit board and the second circuit board, the first security layer disposed between a lower exterior surface of the second circuit board and the upper exterior surface of the first circuit board, the lower exterior surface of the second circuit board forming a continuous, unbroken layer coving a bottom of a respective at least one trace plane of the second circuit board; and at least one electronic component secured to the first circuit board and positioned within the opening of the first security layer, wherein the core material of the first printed circuit board, the first security layer, and the at least one electronic component cooperate to fully enclose the plurality of traces of the circuit board assembly such that the plurality of traces are blocked from external physical access, the core material of the first printed circuit board forming a continuous, unbroken layer covering a lower surface of the bottom-most traces of the plurality of traces.

18. The method of claim 17, wherein an electrical connection between the first circuit board and the at least one electronic component consists of a ball grid array.

* * * * *